(12) United States Patent
Hopper et al.

(10) Patent No.: US 6,809,402 B1
(45) Date of Patent: Oct. 26, 2004

(54) REFLOWABLE-DOPED HDP FILM

(75) Inventors: Dawn Hopper, San Jose, CA (US); Minh Van Ngo, Fremont, CA (US); Atul Gupta, Sunnyvale, CA (US); Tyagamohan Gottipati, Sunnyvale, CA (US); John Caffall, San Carlos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 16 days.

(21) Appl. No.: 10/217,403

(22) Filed: Aug. 14, 2002

(51) Int. Cl.[7] ............... H01L 29/76; H01L 29/94; H01L 31/062; H01L 31/113; H01L 31/119; H01L 23/58; H01L 21/4763; H01L 21/3205

(52) U.S. Cl. ............... 257/647; 257/632; 257/288; 438/588; 438/594; 438/593

(58) Field of Search ............... 257/288, 296, 257/298, 300, 315, 316, 338, 351, 632, 647; 438/588, 594, 595

(56) References Cited

U.S. PATENT DOCUMENTS

| | | | |
|---|---|---|---|
| 6,180,466 B1 * | 1/2001 | Ibok | 438/296 |
| 6,420,250 B1 * | 7/2002 | Cho et al. | 438/595 |
| 6,444,544 B1 * | 9/2002 | Hu et al. | 438/467 |
| 6,518,130 B1 * | 2/2003 | Ohno | 438/275 |
| 6,613,657 B1 * | 9/2003 | Ngo et al. | 438/588 |
| 2002/0173128 A1 * | 11/2002 | Muller et al. | 438/574 |
| 2003/0124803 A1 * | 7/2003 | Ueda et al. | 438/262 |

* cited by examiner

Primary Examiner—Nathan J. Flynn
Assistant Examiner—Victor A. Mandala, Jr.
(74) Attorney, Agent, or Firm—McDermott Will & Emery LLP

(57) ABSTRACT

Device leakage due to spacer undercutting is remedied by depositing a B-doped HDP or a BP-doped HDP oxide gap filling layer capable of flowing into undercut regions. Embodiments include depositing a B or BP-doped HDP oxide film containing 4 to 6 wt. % B over closely spaced apart non-volatile transistors and heating during and subsequent to deposition to complete flowing of the B- or BP-HDP oxide into and filling the undercut regions on the sidewall spacers and to densify the B- or BP-HDP oxide.

18 Claims, 4 Drawing Sheets

REFLOWABLE-DOPED HDP FILM

FIELD OF THE INVENTION

The present invention relates to a method of manufacturing semiconductor devices having high reliability, and to the resulting devices. The present invention has particular applicability in manufacturing highly miniaturized non-volatile semiconductor devices with reduced device leakage.

BACKGROUND ART

Various issues arise in attempting to satisfy the ever increasing demands for miniaturization, particularly in fabricating non-volatile semiconductor devices, such as flash memory devices, e.g., electrically erasable programmable read only memory (EEPROM) devices. The demands for continuing miniaturization have led to the fabrication of flash memory devices comprising transistors having a gate width of about 0.18 micron and under and gate structures spaced apart by a small gap of about 0.33 micron or less. In accordance with conventional practices, an oxide sidewall spacer is formed on side surfaces of the gate stack and a conformal silicon nitride layer, serving as an etch stop layer, is deposited over the gate structures including the sidewall spacers, thereby further reducing the gap between gate structures to about 0.25 micron or less. In accordance with conventional practices, a first interlayer dielectric ($ILD_0$) is deposited over the gate structures and fills the gaps therebetween. Gap filling is then implemented followed by rapid thermal annealing, as at a temperature of about 820° C. for about 120 seconds.

As the distance between sidewall spacers of neighboring gate structures, after depositing the etch stop layer decreases to below about 0.125 micron, it becomes extremely difficult to fill the gaps with a gap fill oxide, even after post deposition rapid thermal annealing, without void formation. Such voiding in $ILD_0$ can lead to an open contact and shorting between contacts, thereby causing leakage and low production yields.

As miniaturization of flash technology proceeds apace, additional problems are encountered with respect to $ILD_0$ integrity as the aspect ratio of the gate stacks increases to about 3.0 and higher. It was found that undercutting of the sidewall spacers occurs, and even extends into the substrate surface. It is believed that such undercutting stems in part from undercutting of the oxide liner during wet cleaning with diluted hydrofluoric acid, such as hydrofluoric acid diluted with water at a level of 10:0 to 300:1, prior to metal deposition in implementing salicide technology. In addition, after silicidation, etching is conducted to remove unreacted metal remaining on the sidewall spacers, thereby attacking the silicon under the spacers, exacerbating the undercut regions. Attempts to deposit a phosphorous (P)-doped high density plasma (P-HDP) oxide layer as a gap fill layer have not been successful in filling these undercut regions, as such P-HDP oxide layers do not have sufficient fluidity. Consequently, the undercut regions remain as voids, thereby adversely impacting device reliability, as by facilitating boron penetration from the gate electrode through the gate oxide into the substrate, resulting in leakage upon rapid thermal annealing, as at a temperature of about 840° C. for about three minutes, during densification.

Accordingly, there exists a need for methodology enabling the fabrication of semiconductor devices, particularly flash memory devices, such as EEPROMs, with improved reliability. There exists a particular need for methodology enabling the fabrication of flash memory devices, such EEPROMs, with no or significantly reduced voids in the $ILD_0$ by enabling gap filling between neighboring transistors such that the undercut regions in sidewall spacers are filled.

DISCLOSURE OF THE INVENTION

An advantage of the present invention is a method of manufacturing a semiconductor device exhibiting improved reliability.

Another advantage of the present invention is a method of manufacturing a flash memory semiconductor device with improved reliability.

A further advantage of the present invention is a method of manufacturing a flash memory device with reduced voids in the $ILD_0$ between closely spaced apart transistors and filled in undercut regions in sidewall spacers.

Another advantage of the present invention is a reliable semiconductor device having reduced leakage by virtue of oxide filled undercut regions in dielectric sidewall spacers on side surfaces gate electrodes.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming two gate electrode structures with a gap therebetween on a semiconductor substrate; forming dielectric sidewall spacers on side surfaces of the gate electrode structures with undercut regions at the substrate; and depositing a boron (B)-doped high density plasma (B-HDP) or a B and phosphorus (P)-doped high density plasma (BP-HDP) oxide film to fill the gap, the B-HDP or BP-HDP oxide film having sufficient fluidity to flow into the undercut regions.

Embodiments of the present invention comprise forming flash memory gate stacks with silicon oxide spacers having undercut regions at the semiconductor substrate, forming a conformal etch stop layer thereon, such as silicon nitride, and then depositing a B-HDP or BP-HDP oxide film containing 4.0 to 6.0 wt. % B or containing 4.0 to 6.0 wt. % B and 4.0 to 6.0 wt. % phosphorus (P) filling the gap. Heating is conducted during and after deposition to cause the B-HDP or BP-HDP oxide film to flow into and fill the undercut regions. Embodiments of the present invention include heating at a temperature of 550° C. to 750° C. during deposition and at a temperature of 700° C. to 1,000° C. after deposition to complete reflowing of the B-HDP or BP-HDP oxide into and filling the undercut regions and to densify the oxide film.

Another advantage of the present invention is a semiconductor device comprising: two gate electrode structures, spaced apart by a gap, on a semiconductor substrate; dielectric sidewall spacers on side surfaces of the gate electrode structures; the dielectric sidewall spacers having undercut regions at the substrate, and a boron (B)-doped high density plasma (B-HDP) or a B and phosphorus (P)-doped high density plasma (BP-HDP) oxide film filling the gap between the gate electrode structures and filling the undercut regions.

Additional advantages of the present invention will become readily apparent to those skilled in this art from the following detailed description wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 4, similar features or elements are denoted by similar reference characters.

DESCRIPTION OF THE INVENTION

The present invention addresses and solves various reliability problems attendant upon conventional semiconductor device fabrication techniques. The present invention provides efficient methodology enabling the fabrication of semiconductor devices exhibiting greater reliability. The present invention particularly addresses and solves device degradation problems stemming from the formation of undercut regions at the bottom of sidewall spacers formed on non-volatile gate electrodes, which undercut regions may extend into the substrate, thereby forming voids and facilitating B diffusion from the gate electrode through the tunnel oxide into the semiconductor substrate, resulting in undesirable leakage problems.

Figure 1:
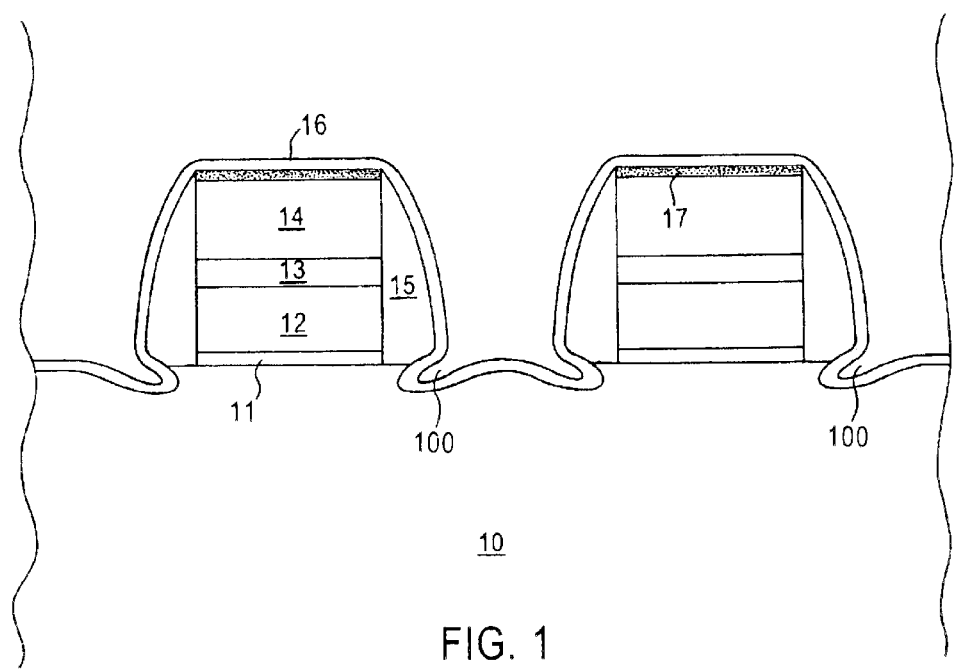
FIGS. 1 and 2 schematically illustrate the undercutting problem solved by the present invention.
Figure 2:
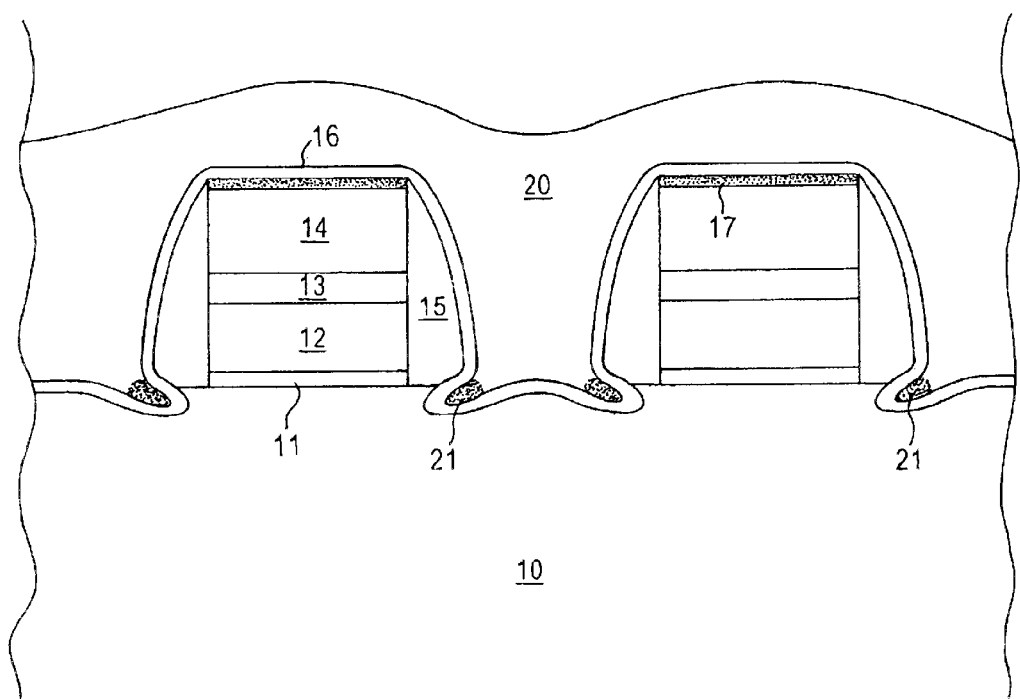

Adverting to FIG. 1 there are schematically illustrated closely spaced apart gate electrode stacks of non-volatile transistors formed on substrate 10. For illustrative convenience, the associated source/drain regions are not depicted. Each gate electrode stack comprises a tunnel oxide 11, a floating gate 12, a dielectric layer 13, such as a silicon oxide/silicon nitride/silicon oxide (ONO) layer, and a control gate electrode 14 formed thereon. Silicon oxide sidewall spacers 15 are formed on side surfaces of the gate electrode stacks. Prior to implementing salicide technology, wet cleaning is conventionally performed, as with dilute hydrofluoric acid, which attacks the silicon oxide sidewall spacers 15 resulting in undercutting. Such undercutting is exacerbated after metal silicidation during acid cleaning to remove unreacted metal from silicon oxide sidewall spacers 15, thereby extending the undercut regions into the semiconductor substrate as illustrated by reference character 100. Reference character 17 illustrates a metal silicide layer such as cobalt silicide or nickel silicide formed on control gate electrode 14. A metal silicide layer is also formed on the source/drain regions but not depicted for illustrative convenience. A silicon nitride liner 16 is then deposited over the gate electrode structures and extends into the undercut regions 100 but does not fill these regions. Upon subsequent deposition of gap fill $ILD_0$ 20, as illustrated in FIG. 2, voids 21 are generated because of the inability of the deposited oxide layer 20 to flow into and fill the undercut regions 100. The presence of such voids 21 adversely impacts device reliability and exacerbates B penetration from the gate electrodes into the substrate, thereby generating leakage issues. Such B penetration typically occurs during rapid thermal annealing at a temperature of about 840° C. for about 3 minutes.

The present invention addresses and solves that problem by depositing an HDP oxide strategically formulated to exhibit increased fluidity by incorporating a sufficient amount B, such that the B-HDP or BP-HDP oxide film flows into and fills the undercut regions 100 (FIG. 1), thereby improving device reliability by reducing leakage.

In accordance with embodiments of the present invention, an HDP oxide film is deposited containing 4.0 to 6.0 wt. % B, which imparts sufficient fluidity to the B-HDP or BP-HDP oxide film to enable filling undercut regions. The HDP oxide employed in the present invention to which B is added for improved fluidity can also contain phosphorous (P), as in an amount of 4.0 to 6.0 wt. %, for gettering purposes. After experimentation and investigation, it was found by incorporating at least 4.0% B into an HDP oxide film, sufficient reflow characteristics could be imparted to enable filling undercut regions even in situations where gate electrode stacks are spaced apart by less than 0.125 micron, and even with high aspect ratios of 3 or more.

Embodiments of the present invention comprise depositing the B-HDP or BP-HDP oxide film temperature of 550° C. to 750° C., an oxygen ($O_2$) flow rate of 100 to 5,000 sccm, a helium (He) flow rate of 100 to 8,000 sccm, a silane ($SiH_4$) flow rate of 50 to 1,500 sccm, a phosphine ($PH_3$) flow rate of 50 to 1,500 sccm, a diborane ($B_2H_6$) flow rate of 50 to 1,500 sccm, a high frequency power of 1,000 to 5,000 watts and a low frequency power of 1,000 to 5,000 watts. Subsequent to such deposition, heating can be implemented, as at temperature of 700° C. to 1,000° C., such as at about 840° C. for about 2 minutes, or below 840° C. for about 5 minutes, to complete reflow of the B-HDP or BP-HDP oxide film into and filling the undercut regions and to densify the B-HDP or BP-HDP oxide film.

Figure 3:
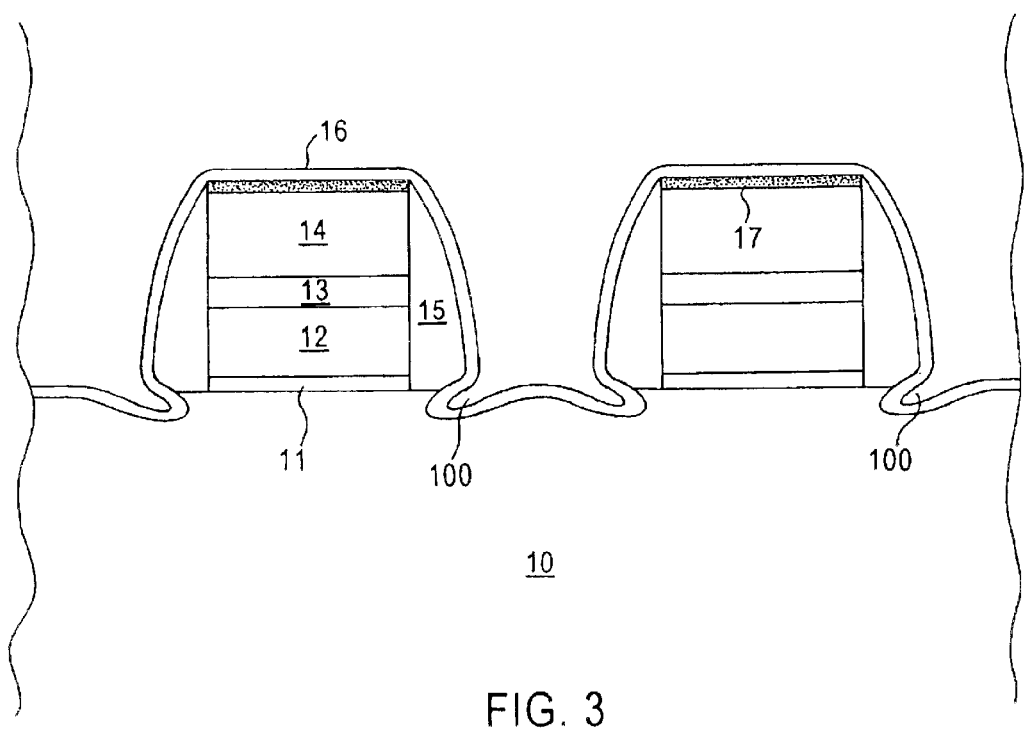
FIGS. 3 and 4 schematically illustrate methodology in accordance with an embodiment of the present invention.
Figure 4:
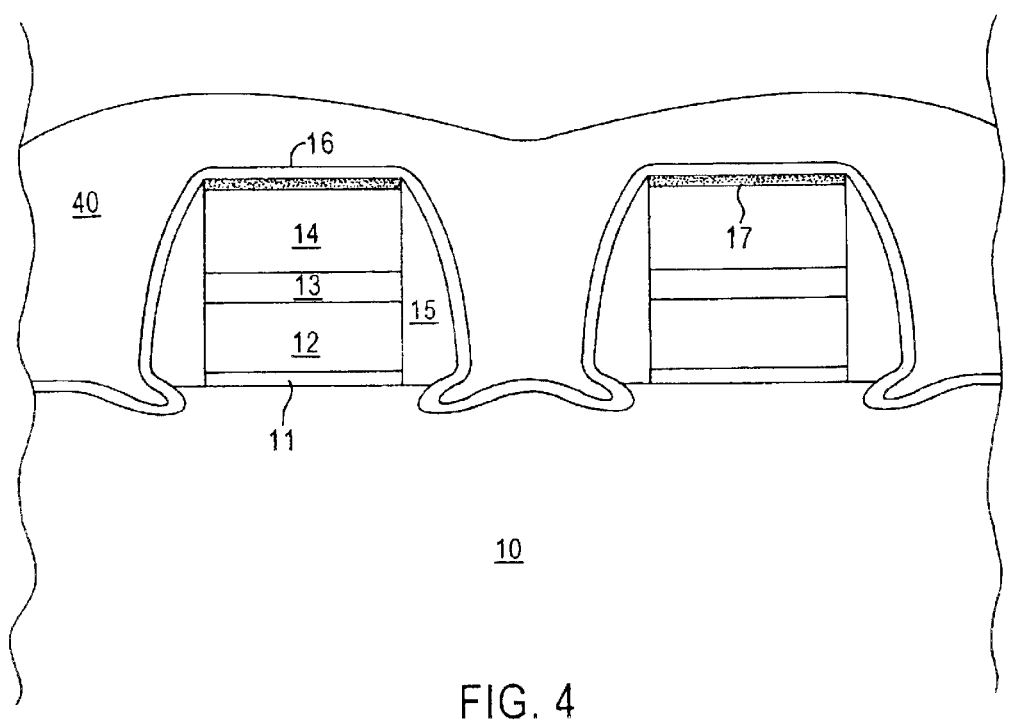

An embodiment of the present invention is schematically illustrated in FIGS. 3 and 4. As schematically shown in FIG. 3 which substantially corresponds to FIG. 1, processing is conducted in a conventional manner to form an intermediate structure comprising substrate 10 with transistors thereon, such as MOS transistors and/or dual gate structures with an (ONO) dielectric therebetween. For example, the transistors may comprise tunnel oxide 11, a floating gate electrode 12, an ONO dielectric 13, and a control gate 14. A layer of metal silicide 17 is formed on an upper surface of the gate electrode stacks. Although not shown for illustrative convenience, a layer of metal silicide is formed on substrate 10 over source/drain regions. A dielectric sidewall spacer 15, such as a silicon oxide spacer, is formed on the side surfaces of the gate electrodes. Typically, each of the gates have a width of about 0.18 micron or less.

During wet cleaning prior to metal deposition for implementing salicide technology silicon oxide sidewall spacers 15 are attacked forming an undercut region. Subsequent to silicidation, unreacted metal remaining on silicon oxide sidewall spacers 15, such as cobalt or nickel, is removed, as by wet etching with a mixture of hydrochloric acid or sulfuric acid and hydrogen peroxide. During such wet etching, the underlying silicon is in substrate 10 is attacked, thereby extending the undercut regions into the semiconductor substrate. Subsequent deposition of a conformal etch stop layer 16, such as silicon nitride, basically traces the undercut regions 100, but the undercut regions 100 remain. The width of the sidewall spacers at the semiconductor substrate should basically extend about 300 Å while the conformal silicon nitride layer 16 is typically formed at a thickness of about 500 Å. The undercut regions 100 typically extend into the dielectric spacer 15, and even into the substrate, for a distance of about 20 Å to about 100 Å, such as about 40 Å to about 60 Å, e.g., about 50 Å. The conformal silicon nitride etch stop layer 16 reduces the gap between adjacent gate electrodes stack to about 0.125 micron or less. Such a small gap and high aspect ratios of three or more, render it extremely difficult to successfully fill the gap without generating voids, much less to fill the undercut regions 100 resulting in undesirable voids.

In accordance with the present invention, as illustrated in FIG. 4, a B-HDP or BP-HDP oxide film 40 is deposited containing at least 4.0 wt. % B, e.g., 4.0 to 6.0 wt. % B, thereby imparting sufficient fluidity to the B-HDP or BP-HDP oxide film to enable penetration into the undercut regions 100 (FIG. 3), as shown in FIG. 4. The B-HDP or BP-HDP oxide film 40 can advantageously contain 4.0 to 6.0 wt. % P for gettering purposes. Subsequent to deposition, rapid thermal annealing may be conducted, as at a temperature of about 840° C. for two minutes, to effect reflowing of the B-HDP or BP-HDP oxide film 40 to complete flowing into and filling the undercut regions 100 and to densify the B-HDP or BP-HDP oxide film. Subsequent processing is then implemented in accordance with conventional methodology, such as planarizing the dielectric layer and forming through holes to establish contacts with source/drain regions.

The present invention provides enabling methodology for fabricating semiconductor devices, particularly flash memory devices with a gate width of no greater than about 0.13 micron and under and gaps of about 0.125 micron and under, with significantly reduced $ILD_0$ voiding and filled in undercut regions in dielectric sidewall spacers at the substrate by strategically depositing an HDP gap filling oxide containing a sufficient amount of B to impart sufficient fluidity to the HDP oxide enabling complete gap filling and filling the undercut regions. By filling in the undercut regions; $ILD_0$ voiding is reduced. In addition, B penetration from the gate electrode into the semiconductor substrate during rapid thermal annealing is reduced, thereby reducing leakage problems.

The present invention enjoys industrial applicability in manufacturing various types of semiconductor devices, particularly highly integrated semiconductor devices exhibiting increased circuit speed and sub-micron dimensions, e.g., with a design rule of about 0.12 micron and under, with high reliability and significantly reduced leakage. The present invention enjoys particular industrial applicability in manufacturing flash memory devices, such as EEPROMs. In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:
    forming two gate electrode structures with a gap therebetween on a semiconductor substrate;
    forming dielectric sidewall spacers on side surfaces of the gate electrode structures, the dielectric sidewall spacers having undercut regions at the substrate; and
    depositing a boron (B)-doped high density plasma (B-HDP) or a B and phosphorus (P)-doped high density plasma (BP-HDP) oxide film to fill the gap, the B-HDP oxide film having sufficient fluidity to flow into the undercut regions.

2. The method according to claim 1, comprising:
    forming silicon oxide spacers as the dielectric sidewall spacers; and
    forming a silicon nitride liner on the silicon oxide sidewall spacers, wherein the silicon nitride liner extends into the undercut regions.

3. The method according to claim 2, comprising heating during and after deposition of the B-HDP or BP-HDP oxide film to flow the B-HDP or BP-HDP oxide into the undercut regions.

4. The method according to claim 3, comprising heating at a temperature of 550° C. to 750° C. during depositing to flow the B-HDP or BP-HDP oxide film into the undercut regions.

5. The method according to claim 3, comprising heating at 700° C. to 1,000° C. after depositing to complete flowing of the B-HDP or BP-HDP oxide film into the undercut regions.

6. The method according to claim 2, comprising depositing the B-HDP or BP-HDP oxide with a B content of 4.0 to 6.0 wt. %.

7. The method according to claim 6, wherein the BP-HDP oxide with 4.0 to 6.0% phosphorous (P).

8. The method according to claim 1 comprising depositing the B-HDP or BP-HDP oxide film at:
    a temperature of 550 to 750° C.;
    an oxygen ($O_2$) flow rate of 100 to 5,000 sccm;
    a helium (He) flow rate of 100 to 8,000 sccm;
    a silane ($SiH_4$) flow rate of 50 to 1,500 sccm;
    a phosphine ($PH_3$) flow rate of 50 to 1,500 sccm;
    a diborane ($B_2H_6$) flow rate of 50 to 1,500 sccm;
    a high frequency power of 1,000 to 5,000 watts; and
    a low frequency power of 1,000 to 5,000 watts.

9. The method according to claim 8, comprising heating at a temperature of 700° C. to 1,000° C., after depositing the B-HDP or BP-HDP oxide film, to complete flowing the oxide film into the undercut regions and to densify the oxide film.

10. The method according to claim 1, wherein;
    wherein each gate electrode structure comprises
        a tunnel oxide on the semiconductor substrate;
        a floating gate electrode on the tunnel oxide;
        a dielectric layer on the floating gate electrode; and
        a control gate electrode on the dielectric layer;
    the dielectric sidewall spacers comprise silicon oxide; and
    a silicon nitride liner is formed over each gate electrode structure and on the silicon oxide sidewall spacers.

11. The method according to claim 1, wherein the undercut regions extent a distance of 20 Å to 100 Å.

12. The method according to claim 1, wherein undercut regions extend into the substrate.

13. A semiconductor device comprising:
    two gate electrode structures, spaced apart by a gap, on a semiconductor substrate;
    dielectric sidewall spacers on side surfaces of each gate electrode structure, the dielectric sidewall spacers having undercut regions at the substrate; and
    a boron (B) doped high density plasma (B-HDP) or a B and phosphorus (P) doped high density plasma (BP-HDP) oxide film filling the gap between the gate electrode structures and filling the undercut regions.

14. The semiconductor device according to claim 13, wherein the B-HDP or BP-HDP oxide contains 4.0 to 6.0 wt. % B.

15. The semiconductor device according to claim 14, wherein the BP-HDP oxide film contains 4.0 to 6.0 wt. % phosphorous.

16. The semiconductor device according to claim 15, wherein:
- wherein each gate electrode structure comprises
  - a tunnel oxide on the substrate;
  - a floating gate electrode on the tunnel oxide;
  - an dielectric on the floating gate; and
  - a controlled gate electrode on the dielectric layer;
- dielectric sidewall spacers comprise silicon oxide; and
- a silicon nitride liner is formed over each gate electrode structure and on the silicon oxide sidewall spacers.

17. The semiconductor device according to claim 14, wherein the undercut regions extend a distance of 20 Å to 100 Å.

18. The semiconductor device according to claim 14, wherein the undercut regions extend into the substrate.

* * * * *